United States Patent [19]

Yerman

[11] Patent Number: 4,809,135
[45] Date of Patent: Feb. 28, 1989

[54] CHIP CARRIER AND METHOD OF FABRICATION

[75] Inventor: Alexander J. Yerman, Scotia, N.Y.

[73] Assignee: General Electric Company, Schenectady, N.Y.

[21] Appl. No.: 124,393

[22] Filed: Nov. 20, 1987

Related U.S. Application Data

[63] Continuation of Ser. No. 892,966, Aug. 4, 1986, abandoned.

[51] Int. Cl.⁴ .............................................. H01R 9/09
[52] U.S. Cl. .................................... 361/404; 361/408; 357/70; 357/80; 174/52.4
[58] Field of Search ........ 361/421, 418, 400, 403–408; 357/79–81, 70; 174/52 FP, 52 PF, 16 HS; 29/827, 829, 831

[56] References Cited

U.S. PATENT DOCUMENTS

| | | | |
|---|---|---|---|
| 3,643,133 | 2/1972 | Towell | 361/407 |
| 3,673,309 | 6/1972 | Dalmasso et al. | 361/421 X |
| 3,689,336 | 9/1972 | Bunker et al. | 174/52 FP X |
| 4,017,770 | 4/1977 | Valfre | 361/421 X |
| 4,079,511 | 3/1978 | Grabbe | 357/70 X |
| 4,408,218 | 10/1983 | Grabbe | 357/70 |
| 4,567,545 | 1/1986 | Mettler, Jr. | 361/421 X |

Primary Examiner—A. D. Pellinen
Assistant Examiner—Todd E. DeBoer
Attorney, Agent, or Firm—Robert Ochis; James C. Davis, Jr.; Marvin Snyder

[57] ABSTRACT

A ceramic chip carrier comprising a ceramic substrate and a copper lead frame directly bonded to the substrate, the lead frame being formed to provide leads in fringe regions beyond the edges of the substrate which are connected together by a removable rim and adapted to be suitably formed to make electrical and mechanical contact with the conductive runs on a printed circuit board.

16 Claims, 2 Drawing Sheets

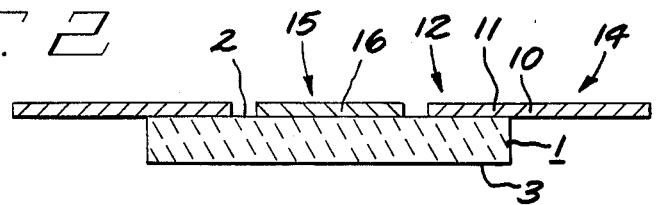
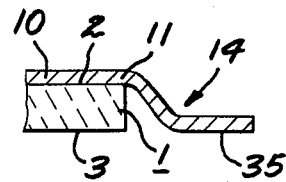
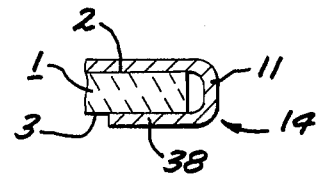
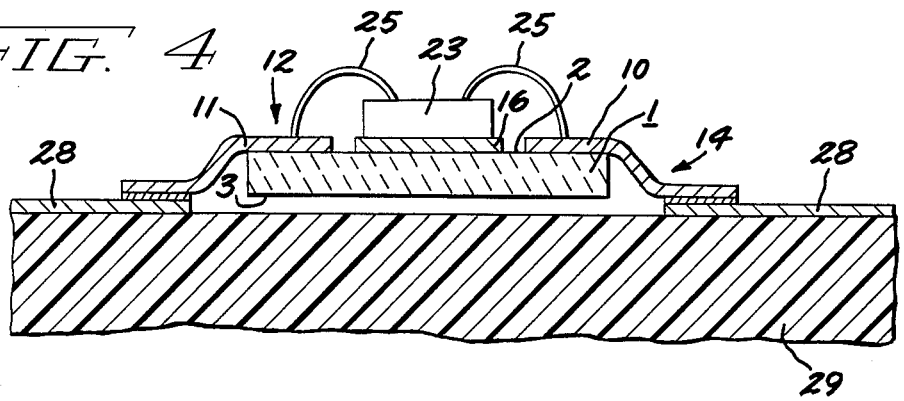
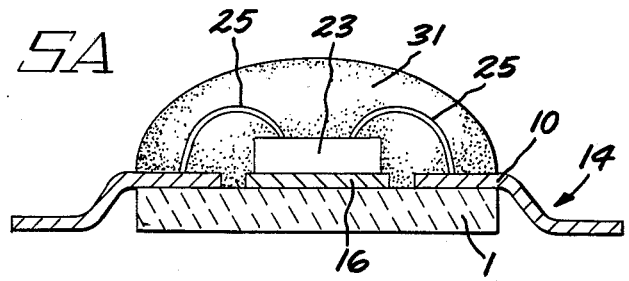
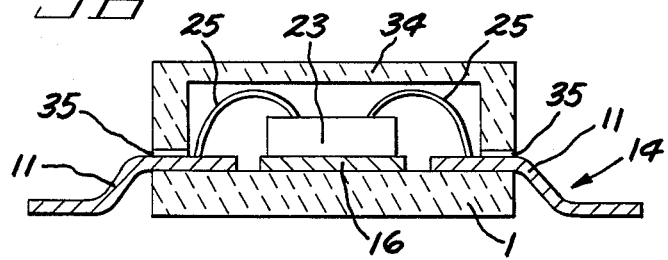

CHIP CARRIER AND METHOD OF FABRICATION

This application is a continuation of application Ser. No. 892,966, filed Aug. 4, 1986 now abandoned.

BACKGROUND OF THE INVENTION

This application relates generally to integrated circuit chip carrier designs and specifically to leaded ceramic chip carriers fabricated utilizing the direct bond process for securing a copper lead frame to a ceramic substrate.

Integrated circuits are produced in the form of flat, generally rectangular chips which have terminal areas or terminal pads usually located along the side edges of the chip. In order to assemble such an integrated circuit chip into a complex circuit assembly the chip is usually mounted or packaged in a chip carrier. Chip carriers are designed to provide electrically conductive paths from the chip terminals to the edge of the chip carrier package (or beyond) so that the chip can be connected to further circuitry external to the carrier.

To accomplish the above requirements, chip carriers usually provide a lead frame comprising a plurality of leads supported on an insulating substrate or in a housing. The leads are provided with first regions proximate the chip terminals, which are adapted for electrical coupling (either directly or through an intermediate conductor) to the chip terminals to thereby complete an electrical connection between the lead frame and the chip terminals. The leads of the lead frame are also provided with second regions usually proximate an edge of the insulating substrate or housing, which are adapted for electrical coupling (either directly or indirectly) to electrical circuitry external to the carrier. This latter connection is accomplished in leadless chip carrier designs by means of terminals fixedly carried by the chip carrier body. Alternatively, in leaded carrier designs, these latter connections are accomplished by means of bridging conductors or leads which electrically interconnect the second regions of the lead frame leads to external circuits. In the case where the chip package is mounted on a printed circuit board, these external circuits consist of conductive runs on the surface of a printed circuit board.

A currently popular arrangement used to assemble chips into complex circuit assemblies is the leadless ceramic chip carrier in which fixed terminals on the ceramic carrier body are mounted or soldered directly to printed circuit runs on the surface of a printed circuit board. Such an arrangement is favored when it is necessary to meet the requirements of a demanding environment. In particular, such ceramic carrier arrangements are typically used or specified for military applications and for use in industrial computer and telecommunication applications, particularly where hermeticity is desired. Additionally, where high density surface mounting is mandatory chip carriers of the hermetically sealed leadless type are most frequently used. However, such arrangements cause undue stress on solder joints which interface the terminals of the chip carrier with the conductive runs on the printed circuit board. These stresses arise because of the large thermal mismatch between the chip carrier's alumina body (with a thermal coefficient of expansion of approximately 6 ppm/°C.) and printed circuit board materials of various kinds with type thermal coefficients of expansion in the approximate range of 20 to 30 ppm/°C.). These differences in the coefficients of thermal expansion of the ceramic carrier and underlying printed circuit board materials result in stresses at the electrical connections between the terminals on the body of the ceramic carrier and the conductive runs on the p.c. board surface which supports the package, and elsewhere in the assembly.

One general solution to the above discussed problem is to provide a board material that will nearly match the thermal coefficient of expansion of the alumina carrier. The military has concentrated its efforts on this method, i.e., a construction which approximately matches the ceramic's thermal coefficient of expansion to that of the underlying structure. A popular method to accomplish this is to use sandwiched layers of either copper-Kevlar-copper, copper-molybdenum-copper, or epoxy-graphite as the inner core of the multilayer structure. This diminishes the problem of thermal expansion mismatch since the inner core's thermal characteristics dominate the composite thermal coefficient of expansion and match that of the carrier's ceramic. Another variation is to use rigid composites, such as polyimide reinforced Kevlar or quartz, to achieve the low thermal coefficient of expansion required. These materials have sufficiently low thermal coefficients of expansion to keep shear strains of the solder joint to a minimum. However, routing and drilling of quartz in Kevlar fabric-reinforced composites are extremely difficult. In addition, microcracking of the brittle polyimide matrix resulting from excessive radial expansion of Kevlar fibers has stalled the widespread acceptance of polyimide Kevlar. The above methods, while promising, are expensive to implement.

A second general solution to the thermal mismatch problem is to provide compliant leads on the ceramic carrier, but the current methods of doing this add significant complexity and expense to an already costly unit because they use a variety of soldering, brazing, welding or thick film application steps.

With the use of compliant leads, the strain resulting from differing rates of thermal expansion between the ceramic substrate and the printed circuit board is dissipated by small and free movements of the leads which provide not only electrical connection to the conductive runs on the p.c. board, but also mechanical support for the chip package.

This application is directed to an improved chip carrier construction and method which overcomes the disadvantages of the prior art techniques for providing leaded ceramic chip carriers.

OBJECTS AND SUMMARY OF THE INVENTION

A primary object of the invention, therefore, is to provide an improved leaded ceramic integrated chip carrier.

A further object is to provide a chip carrier which is fabricated by the direct bond copper process to provide, as a result of such process, a series of leads suitable not only for interconnection to the chip on the one hand, but to the conductive runs of a printed circuit board, on the other.

A yet further object is to provide a leaded integrated chip carrier which exhibits good fatigue life and power dissipation characteristics, yet is relatively straightforward to fabricate.

A still further object of the invention is to provide a ceramic chip carrier having high compliant leads extending therefrom which are, without further processing, formable to accommodate a variety of printed circuit board assembly processes.

Another object is to provide a leaded ceramic chip carrier suitable for accommodating several methods of protecting the chip from the external environment.

A still further object is to provide a ceramic chip carrier having a unitary lead frame which serves to electrically couple both to the chip pads proximate an interior region of the lead frame and to external components proximate an outlying or fringe region of the lead frame structure.

Yet another object is to provide a ceramic carrier which overcomes the problem of thermal mismatch between the carrier body and the underlying printed circuit board support material by providing compliant leads which operate to absorb stresses accompanying changes in temperature.

A further object is to provide a leaded ceramic chip carrier having the above features which is easily and inexpensively fabricated using conventional direct bond manufacturing techniques.

These and other objects of the invention are accomplished by the provision of an integrated circuit chip carrier comprising a ceramic substrate and a lead frame carried on the substrate and comprising a plurality of individual leads. The lead frame includes a central region proximate the center of the ceramic substrate and adapted for connection to the integrated circuit chip by conventional means. The lead frame also includes a outlying or fringe region extending beyond the edges of the supporting ceramic substrate and adapted for electrical coupling to the conductive runs in a printed circuit board. The fringe region of the lead frame is constructed with a removable border or rim for enabling the precise positioning of these leads in contact with complementary conductive runs on the circuit board. The leads in the fringe region are compliant and formable into a plurality of shapes to better enable the solder joints which couple these leads to the circuit board runs to be relieved of mechanical stress when the completed circuit board assembly is subjected to large temperature changes. Thus, the leads extending from the chip carrier provide not only paths for electrical coupling to the supporting circuit board, but also an expansion absorptive mechanism for supporting the carrier (and chip) on the circuit board.

BRIEF DESCRIPTION OF THE DRAWINGS

Further objects of the invention together with additional features contributing thereto and advantages derived therefrom will be apparent from the following description of preferred embodiments of the invention which are shown in the accompanying drawings, with like reference numerals indicating corresponding parts throughout, wherein:

FIG. 2 shows the components of the leaded chip carrier of the invention after they are joined together via a direct bond process;

FIGS. 3A and 3B illustrate the forming of the fringe or outlying portions of the leads into various shapes useful for completing the electrical connections between the chip carrier and the conductive runs on the printed circuit board;

FIG. 4 illustrates an integrated circuit chip carried in place on the chip carrier according to the invention with interconnections between the chip and the carrier leads, and between the carrier leads and the printed circuit board runs shown; and FIGS. 5A and 5B illustrate two forms of encapsulating a chip mounted in accordance with the teachings of the invention for hermetic sealing purposes.

DETAILED DESCRIPTION OF THE INVENTION

Figure 1:
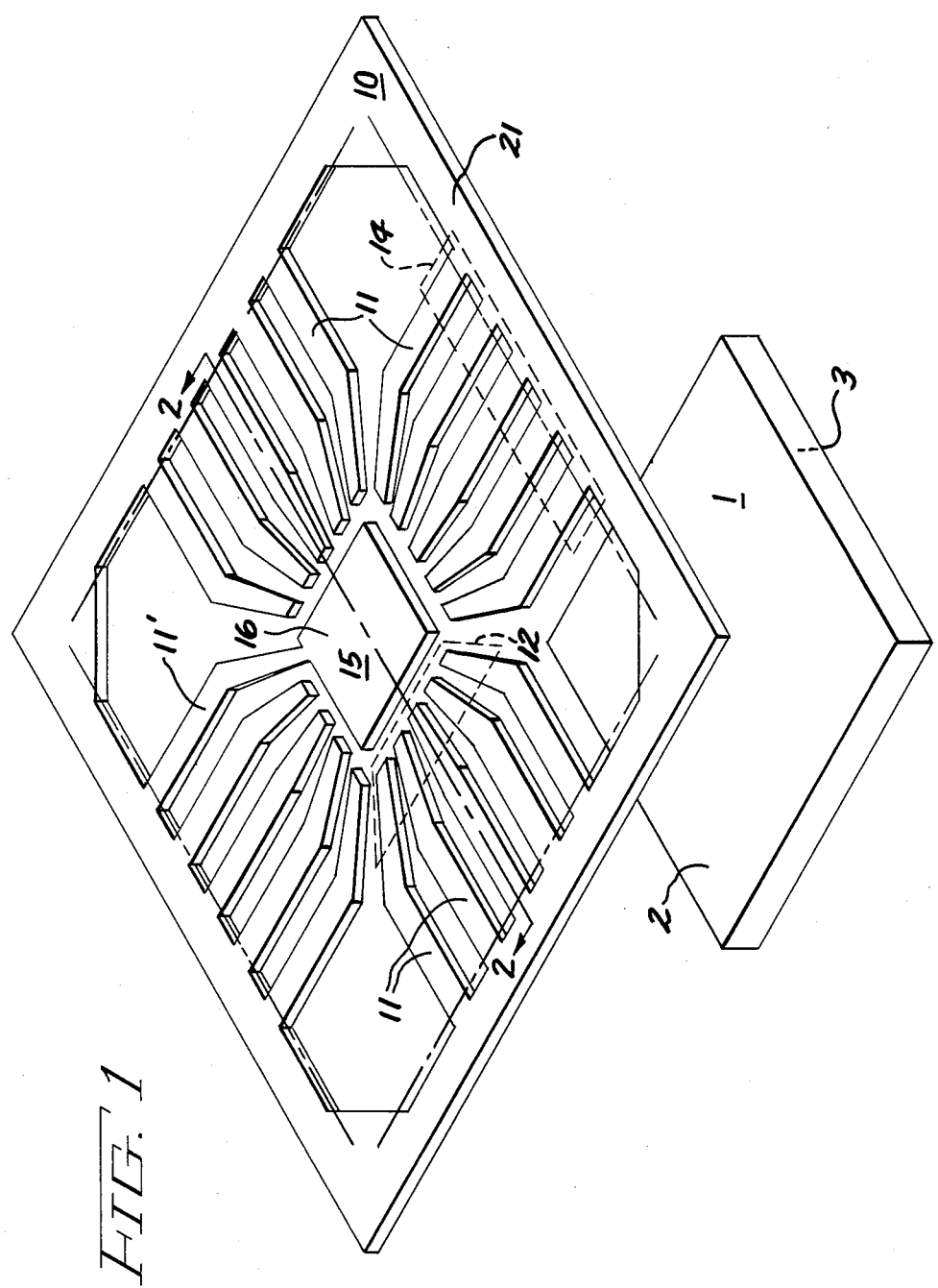
FIG. 1 is a perspective view illustrating the main components of the leaded chip carrier of the invention, namely, the substrate and the lead frame, with the lead frame shown above and separated from the substrate prior to undergoing processing by which they are joined together by a direct bond process.

Referring to FIGS. 1, 2 and 4, there is illustrated a ceramic substrate 1 which is formed of a suitable refractory material, preferably alumina, beryllia, silicon carbide, aluminum nitride, or other ceramic material having similar or equivalent properties. Beryllia and aluminum nitrides are particularly useful since they exhibit a high thermal conductivity which makes them particularly useful for higher power semiconductor integrated circuit applications. The substrate 1 is generally square or rectangular in form, but may be any one of several different shapes most suitable to the intended design or application. The thickness of substrate 1 is generally in the range of 10 to 60 mils, but the exact thickness may vary widely in use and is usually not a critical parameter in normal applications. The substrate 1 is shown as having planar upper and lower face, 2 and 3, respectively, as seen in the drawings.

A lead frame 10 is shown for illustration purposes in FIG. 1 positioned immediately above the substrate 1. The lead frame 10 is to be bonded or secured to the substrate 1 by the direct bond process set forth in the patents of Burgess et al. (U.S. Pat. No. 3,744,120), Babcock et al. (U.S. Pat. No. 3,766,634), Burgess et al. (U.S. Pat. No. 3,854,892), Burgess et al. (U.S. Pat. No. 3,911,553), Cusano et al. (U.S. Pat. No. 3,994,430) and Cusano et al. (U.S. Pat. No. 4,129,243). The lead frame 10 is composed of a thin layer or sheet of copper generally square or rectangular in shape and having a thickness range of approximately 0.003 to 0.010 inch. While copper is the preferred metal for the lead frame 10 because of its high electrical and thermal conductivity, other materials (including laminations and alloys of different metals) may be used. A listing of appropriate alternatives may be had by consulting the aforementioned patents. The copper layer is first chemically etched to form the desired lead frame pattern using standard photolithography techniques during which the pattern is transferred from a mask to a photosensitive emulsion on the copper. A stamping process or equivalent process may alternatively be used to form the lead frame pattern.

In this manner, the lead frame is patterned to comprise a plurality of leads 11 having interior regions 12 adjacent a center area 15 and outlying or fringe regions 14 located in peripheral areas of the lead frame. One of the leads 11' has formed integral therewith a rectangularly shaped copper pad 16 located centrally of the body of the lead frame 10. The purpose of the pad 15 is to provide a conductive surface or ground plane upon which an integrated circuit chip may be supported at a preselected electrical potential which is applied to lead 11'. The fringe region 14 of the leads is terminated in a border or rim 21 which interconnects all of the leads 11 to each other in the fringe region 14. As can be seen from the drawings, the size and shape of the lead frame 10 is selected, relative to the size and shape of the substrate 1, so that the fringe regions 14 of the leads and the rim 21 are located beyond the edges of the substrate when the lead frame is brought into contact with and centered on the substrate. The supporting rim 21 provides for accurate and constant spacing between the leads of the lead frame during the below described bonding of the lead frame to the ceramic substrate.

While the details of the copper bonding process are more fully explained in the above noted patents, a brief review of the process will now be given. The copper lead frame 10 is pretreated in a manner to form copper oxide as required for the eutectic bond process. It is then bonded to the ceramic substrate by first placing it in contact with the ceramic substrate, then heating these components to a temperature slighly below the melting point of the copper. The heating step is carried out in a slightly oxidizing atmosphere, for a sufficient time to create a copper-copper oxide eutectic melt which wets the copper lead frame and the ceramic substrate and, upon cooling, bonds the copper to the substrate. When the above preferred materials are used, the combination is heated to between approximately 1065° C. to 1070° C. in an oven or other suitable chamber to produce the copper-copper oxide eutectic which performs the bonding function.

As a result of processing the substrate 1 and lead frame 10 in accordance with the above direct bonding process, the lead frame becomes secured to the substrate; where the copper film contacts the ceramic (region 12), an intimate $Cu-C_2O$ eutectic bond results and, conversely, where the copper lead frame overhangs the substrate (principally in the fringe regions 14 and outwardly), it remains unbonded. Since the leads are connected together during the bonding phase, they hold their position relative to each other.

The lead frame can be left in place until after chip mounting or it can be processed to remove the rim generally along the dash-dot line shown in FIG. 1 by using a shear pinch cutting, etching or other equivalent removal procedure. The shear pinch cutting procedure is advantageous with certain static sensitive components. In the cutting procedure the ends of the leads in the fringe region 14 about the periphery of the lead frame 10 are freed from connection to each other. The length of these resulting leads may be controlled by properly selecting the original size of the lead frame and/or by suitably selecting the line of cut when removing the rim. The resulting structure, with the lead frame 10 attached to a substrate 1 (with the rim 21 of the lead frame removed) is shown in FIG. 2.

The integrated circuit chip 23, FIG. 4, if not previously mounted and lead bonded may then be mounted on the central support pad 16 of the lead frame 10 by any conventional means, such as a conductive epoxy adhesive or other appropriate metallized glue or solder in order to guarantee the desired electrical and thermal conductivity. The terminal pads (not shown) on the integrated circuit chip are then electrically coupled to complementary leads 11 on the lead frame by means of connecting wires 25. The connection may be accomplished by means of thermo-compression, ultrasound or other similar techniques.

The lead 11 in the fringe region 14 may then be formed so as to adapt them for coupling with corresponding conductive runs on tracks 28, FIG. 4, on the upper surface of the printed circuit board 29. Two such formations for this purpose are shown in FIGS. 3A and 3B. In FIG. 3A the leads 11 are bent downwardly and outwardly to form a planar surface 35 generally coplanar with lower face 3 of the substrate. In that fashion, when the carrier is ultimately attached to the printed circuit board it is displaced a small distance above the surface of the board. As a result of the forming process the fringe region 14 of the leads 11 form a compliant mechanical support for the carrier such that during temperature changes, the pressures and stresses caused by a mismatch between the coefficients of thermal expansion of the ceramic 1 and the board 29 are absorbed through lateral shifts of the leads.

An alternative shape for the formed leads 11 in the fringe region 14 is shown in FIG. 3B in which the ends 38 of the leads 11 reversely bend in a manner such that the ends 38 are contiguous with, but not bonded in any manner to the bottom face 3 of the substrate 1. In this manner, and similar to the operation of the leads in FIG. 3A, the stresses caused by thermal mismatch between the substrate 1 and printed circuit board are absorbed by small sliding movement of the ends 38 along the lower surface of the substrate.

If desired, the manufacturing process for a completed assembly may provide for protecting the integrated circuit chip from the environment by a hermetic sealing formation, as shown in FIGS. 5A or 5B. In FIG. 5A a compliant mass of a suitable organic encapsulant 31 is located to cover the chip and lead frame as shown. In FIG. 5B a ceramic cap 34 is attached with a suitable epoxy or glass adhesive, as shown.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a ceramic chip carrier package and mounting said package onto a circuit board comprising the steps of:
   (a) forming a planar copper lead frame having a plurality of leads, said lead frame being shaped to provide an interior region and a fringe region in which leads are connected together by an integral copper rim;
   (b) positioning said frame with said interior region in abutment with a ceramic substrate with said fringe region of said frame extending beyond the periphery of said substrate;
   (c) heating said lead frame and substrate in a manner to directly bond said interior region of said frame to the substrate and to leave said fringe region of said frame unbonded;
   (d) mounting an integrated circuit chip to the resulting lead frame/substrate combination and electrically coupling terminals on said chip to said leads;
   (e) providing a non-conductive circuit board with a planar surface having conductiveruns carried thereon suitable for electrical coupling to said chip;

(f) removing said rim from said frame and bending said leads in said fringe region in the direction of said circuit board; and (g) bonding said leads in said fringe region of said frame to said conductive runs in a manner to space said substrate above the planar surface of said circuit board and to support said substrate on said leads in a compliant manner which enables said substrate to move relative to said circuit board without movement of said interior region of said frame relative to said substrate and without movement of the bonded portions of said fringe portions of said leads relative to said circuit board.

2. The method of claim 1 wherein said ceramic substrate is taken from a class of materials including alumina, beryllia, aluminum nitride and silicon carbide.

3. The method recited in claim 1 wherein in step (a) all of said leads in said fringe region are connected together by said rim.

4. The method recited in claim 1 wherein step (d) comprises connecting said terminals to portions of said leads in said interior region.

5. The method recited in claim 1 wherein in step (f) said bending of said leads comprises:
bending said leads to place the end portions thereof which are adjacent the free ends thereof substantially in a common plane.

6. The method recited in claim 5 wherein said free end portions of said leads extend laterally beyond said substrate.

7. The method recited in claim 5 wherein said substrate has an opposite surface on its side opposite to that on which said interior portion of said frame is bonded to said substrate and said bending includes bending said leads to place said free end portion of at least one of said leads where it lies adjacent said opposite surface of said substrate.

8. The method recited in claim 7 wherein said bending includes bending all said leads to place said free end portions thereof where they lie adjacent said opposite surface of said substrate.

9. A method of forming a ceramic chip carrier package and mounting said package onto a circuit board comprising the steps of:

(a) forming a planar copper lead frame having a plurality of leads, said lead frame being shaped to provide an interior region and a fringe region in which leads are connected together by an integral copper rim;

(b) positioning said frame with said interior region in abuttment with a ceramic substrate with said fringe region of said frame extending beyond the periphery of said substrate;

(c) heating said lead frame and substrate in a manner to directly bond said interior region of said frame to the substrate and to leave said fringe region of said frame unbonded;

(d) mounting an integrated circuit chip to the resulting lead frame/substrate combination and electrically coupling terminals on said chip to said leads;

(e) providing a non-conductive circuit board with a planar surface having conductive runs carried thereon suitable for electrical opling to said chip;

(f) removing said rim from said frame and bending said leads in said fringe region in the direction of said circuit board; and (g) bonding said leads in said fringe region of said frame to said conductive runs in a manner to support said substrate above the planar surface of said circuit board on said leads in a compliant manner which enables said substrate to move relative to said circuit board without movement of said interior region of said frame relative to said substrate and without movement of the bonded portions of said fringe portions of said leads relative to said circuit board.

10. The method recited in claim 9 wherein said ceramic substrate is taken from a class of materials including alumina, beryllia, aluminum nitride and silicon carbide.

11. The method recited in claim 9 wherein in step (a) all of said leads in said fringe region are connected together by said rim.

12. The method recited in claim 9 wherein in step (f) said bending of said leads comprises:
bending said leads to place the end portions thereof which are adjacent the free ends thereof substantially in a common plane.

13. The method of claim 12 wherein said free end portions of said leads extend laterally beyond said substrate.

14. The method recited in claim 12 wherein said substrate has an opposite surface on its side opposite to that on which said interior portion of said frame is bonded to said substrate and said bending includes bending said leads to place said free end portion of at least one of said leads where it lies adjacent said opposite surface of said substrate.

15. The method recited in claim 14 wherein said bending includes bending all said leads to place said free end portions thereof whereby they lie adjacent said opposite surface of said substrate.

16. The method recited in claim 14 wherein step (d) comprises connecting said terminals to portions of said leads in said interior region.

* * * * *